(12) United States Patent
Liang et al.

(10) Patent No.: US 10,209,445 B2
(45) Date of Patent: Feb. 19, 2019

(54) METHOD OF FABRICATING A COMPACT PHOTONICS PLATFORM

(71) Applicant: Hewlett Packard Enterprise Development LP, Houston, TX (US)

(72) Inventors: Di Liang, Santa Barbara, CA (US); David A. Fattal, Mountain View, CA (US); Marco Florentino, Mountain View, CA (US); Zhen Peng, Foster City, CA (US); Charles M. Santori, Palo Alto, CA (US); Raymond G. Beausoleil, Seattle, WA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/976,944

(22) Filed: May 11, 2018

(65) Prior Publication Data

US 2018/0267239 A1    Sep. 20, 2018

Related U.S. Application Data

(62) Division of application No. 14/416,781, filed as application No. PCT/US2012/048788 on Jul. 30, 2012, now Pat. No. 9,995,876.

(51) Int. Cl.
  *G02B 6/34* (2006.01)
  *G02B 6/122* (2006.01)
  (Continued)

(52) U.S. Cl.
  CPC .......... *G02B 6/1225* (2013.01); *B82Y 20/00* (2013.01); *G02B 6/122* (2013.01); *G02B 6/125* (2013.01);
  (Continued)

(58) Field of Classification Search
  CPC ......... G02B 6/1225; G02B 6/34; H01S 5/105; H01S 5/125
  See application file for complete search history.

(56) References Cited

U.S. PATENT DOCUMENTS 4,720,468 A * 1/1988 Menigaux .......... G02B 6/12004
                                              148/DIG. 95
5,070,488 A   12/1991 Fukushima et al.
(Continued)

FOREIGN PATENT DOCUMENTS

CN    1910735       2/2007
CN    102282489     12/2011
(Continued)

OTHER PUBLICATIONS

Eldada, L., "Hybrid Integrated Photonic Components Based on a Polymer Platform," Jan. 28, 2003, pp. 88-102.
(Continued)

*Primary Examiner* — Akm Enayet Ullah
(74) *Attorney, Agent, or Firm* — Sheppard Mullin Richter & Hampton LLP

(57) ABSTRACT

Compact photonics platforms and methods of forming the same are provided. An example of a compact photonics platform includes a layered structure having an active region along a longitudinal axis, a facet having an angle no less than a critical angle formed at at least one longitudinal end of the active region, and a waveguide having at least one grating coupler positioned in alignment with the angled facet to couple light out to or in from the waveguide.

5 Claims, 5 Drawing Sheets

(51) Int. Cl.
*H01S 5/10* (2006.01)
*B82Y 20/00* (2011.01)
*G02B 6/125* (2006.01)
*H01S 5/125* (2006.01)
*G02B 6/12* (2006.01)
*H01S 5/12* (2006.01)

(52) U.S. Cl.
CPC ............... *G02B 6/34* (2013.01); *H01S 5/105* (2013.01); *H01S 5/1032* (2013.01); *H01S 5/1035* (2013.01); *H01S 5/125* (2013.01); *G02B 2006/12121* (2013.01); *G02B 2006/12166* (2013.01); *H01S 5/1085* (2013.01); *H01S 5/1203* (2013.01)

(56) References Cited

U.S. PATENT DOCUMENTS

| | | | |
|---|---|---|---|
| 5,103,456 A | 4/1992 | Scifres et al. | |
| 5,218,584 A | 6/1993 | Gfeller | |
| 6,031,243 A | 2/2000 | Taylor | |
| 6,282,219 B1* | 8/2001 | Butler | G02B 6/12004 372/102 |
| 6,650,401 B2* | 11/2003 | Oka | G01C 3/08 250/201.6 |
| 7,444,048 B2 | 10/2008 | Peters et al. | |
| 7,565,084 B1 | 7/2009 | Wach | |
| 7,948,615 B2 | 5/2011 | Kopp et al. | |
| 8,270,788 B2 | 9/2012 | Herman et al. | |
| 8,283,689 B2* | 10/2012 | Liang | B29C 45/14655 257/98 |
| 8,604,577 B2 | 12/2013 | Koch | |
| 8,731,349 B2 | 5/2014 | Schrauwen et al. | |
| 8,805,126 B2* | 8/2014 | Lee | G02F 1/025 385/2 |
| 9,028,157 B2 | 5/2015 | Na et al. | |
| 9,323,284 B2* | 4/2016 | Foster | G06E 3/003 |
| 2004/0141540 A1 | 7/2004 | Masood et al. | |
| 2004/0165637 A1 | 8/2004 | Bullington et al. | |
| 2005/0157770 A1 | 7/2005 | Behfar et al. | |
| 2006/0118893 A1 | 6/2006 | Behfar et al. | |
| 2006/0227833 A1* | 10/2006 | O'Daniel | H01S 5/1082 372/50.1 |
| 2006/0239612 A1 | 10/2006 | De Dobbelaere et al. | |
| 2008/0080808 A1* | 4/2008 | Tolshikhin | G02B 6/12007 385/14 |
| 2009/0022448 A1 | 1/2009 | Wu et al. | |
| 2009/0034977 A1 | 2/2009 | Tan et al. | |
| 2010/0006784 A1 | 1/2010 | Mack et al. | |
| 2010/0099209 A1 | 4/2010 | Behfar et al. | |
| 2010/0246617 A1 | 9/2010 | Jones | |
| 2010/0309459 A1 | 12/2010 | Fattal et al. | |
| 2010/0316076 A1 | 12/2010 | Behfar et al. | |
| 2010/0322555 A1 | 12/2010 | Vermeulen et al. | |
| 2011/0075970 A1* | 3/2011 | Schrauwen | G02B 6/124 385/37 |
| 2011/0083739 A1 | 4/2011 | Peng et al. | |
| 2011/0129231 A1 | 6/2011 | Fiorentino et al. | |
| 2011/0142395 A1* | 6/2011 | Fortusini | G02B 6/34 385/37 |
| 2011/0158278 A1 | 6/2011 | Koch | |
| 2011/0188806 A1 | 8/2011 | Peng et al. | |
| 2011/0261856 A1 | 10/2011 | Fattal et al. | |
| 2012/0008658 A1 | 1/2012 | Chung | |
| 2012/0027350 A1 | 2/2012 | Fu et al. | |
| 2012/0077294 A1 | 3/2012 | Behfar et al. | |
| 2014/0376857 A1* | 12/2014 | Chantre | G02B 6/12002 385/14 |
| 2016/0380407 A1* | 12/2016 | Sysak | G02B 6/1228 398/214 |

FOREIGN PATENT DOCUMENTS

| | | |
|---|---|---|
| CN | 102388513 | 3/2012 |
| CN | 102403651 | 4/2012 |
| EP | 0623980 A2 | 11/1994 |
| JP | 3153886 | 2/1994 |
| WO | WO-2011104317 A1 | 9/2011 |

OTHER PUBLICATIONS

Extended European Search Report received in EP Application No. 12882854.9, dated Mar. 17, 2016, 10 pages.
International Preliminary Report on Patentability received in PCT Application No. PCT/US2012/048788, dated Feb. 12, 2015, 6 pages.
International Search Report & Written Opinion received in PCT Application No. PCT/US2012/048788, dated Mar. 29, 2013, 9 pages.
Mekis, A. et al., "A Grating-coupler-enabled CMOS Photonics Platform," May-Jun. 2011, pp. 597-608.
Scandurra, A. et al., "Optical Interconnects for Network on Chip," Sep. 1, 2006, 5 pages.
Song, J.H. et al., "Grating Coupler Emedded Silicon Platform for Hybrid Integrated Receivers," Feb. 1, 2012, pp. 161-163.

* cited by examiner

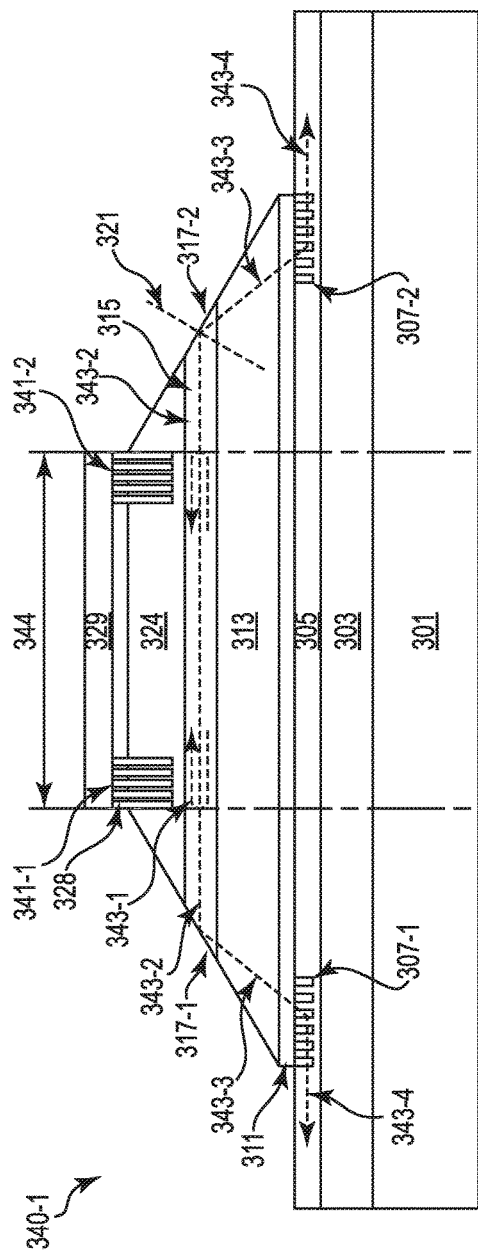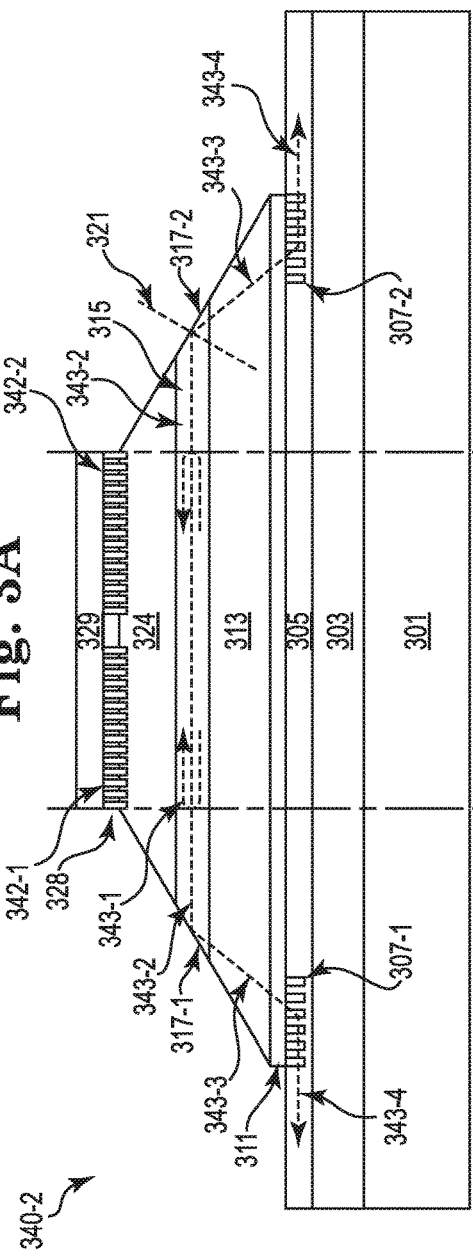

METHOD OF FABRICATING A COMPACT PHOTONICS PLATFORM

RELATED APPLICATIONS

This application is a divisional application of Divisional U.S. application Ser. No. 14/416,781 filed Jan. 23, 2015, which is the National Stage of International Application No. PCT/US2012/048788 filed Jul. 30, 2012.

STATEMENT OF GOVERNMENT RIGHTS

This invention was made with Government support under Contract No. H98230-12-C-0236 awarded by the Maryland Procurement Office. The Government has certain rights in this invention.

BACKGROUND

Photonics may assist in dealing with issues related to increasing power consumption and limited data bandwidth, among others, in electrical interconnect systems. Transmission of light through waveguides has been used for many types of applications. For instance, light sources can be created with semiconductor devices that may use a waveguide as an output medium for light. Alternatively, light may be input through a waveguide. Integrating such functionalities with waveguides can present challenges.

BRIEF DESCRIPTION OF THE DRAWINGS

FIGS. 3A-3B illustrate examples of compact photonic platforms having a resonance cavity shorter than an active region according to the present disclosure.

DETAILED DESCRIPTION

Compact photonic platforms as described herein allow versatile devices to be manufactured, marketed, and/or utilized by a user for a variety of potential applications. For example, such compact photonic platforms can be selectably configured (e.g., by a manufacturer and/or a user, among others) to emit photons through one or both ends of a waveguide after conversion from electrons (e.g., in an active region) and/or to detect photons input through one or both ends of the waveguide after conversion to electrons (e.g., in the active region).

As such, the compact photonic platforms described herein can be utilized as sources of light (e.g., photons), as optical modulators, and/or as photodetectors, among other applications. The compact photonic platforms described herein can be implemented as a general device platform to function in individual photonic components and/or integrated photonic circuits as, for example, optical interconnects, light sources for 3D display, laser optics, etc.

Compact photonics platforms and methods of forming the same are provided. An example of a compact photonics platform includes a layered structure having an active region along a longitudinal axis, a facet having an angle no less than a critical angle formed at at least one longitudinal end of the active region, and a waveguide having at least one grating coupler positioned in alignment with the angled facet to couple light out to or in from the waveguide.

In various examples, the at least one angled facet can be used to couple light from the active region to the waveguide and/or from the waveguide to the active region (e.g., for implementation as a laser, a modulator, and/or a photodetector, among other implementations). In addition, in various examples, optical reflectors (e.g., mirrors) can be formed (e.g., as etched waveguide facets, distributed Bragg reflectors, distributed feedback gratings, among others) within and/or outside the active region to partially or totally reflect light, thereby creating an optical resonance cavity.

Figure 1A:
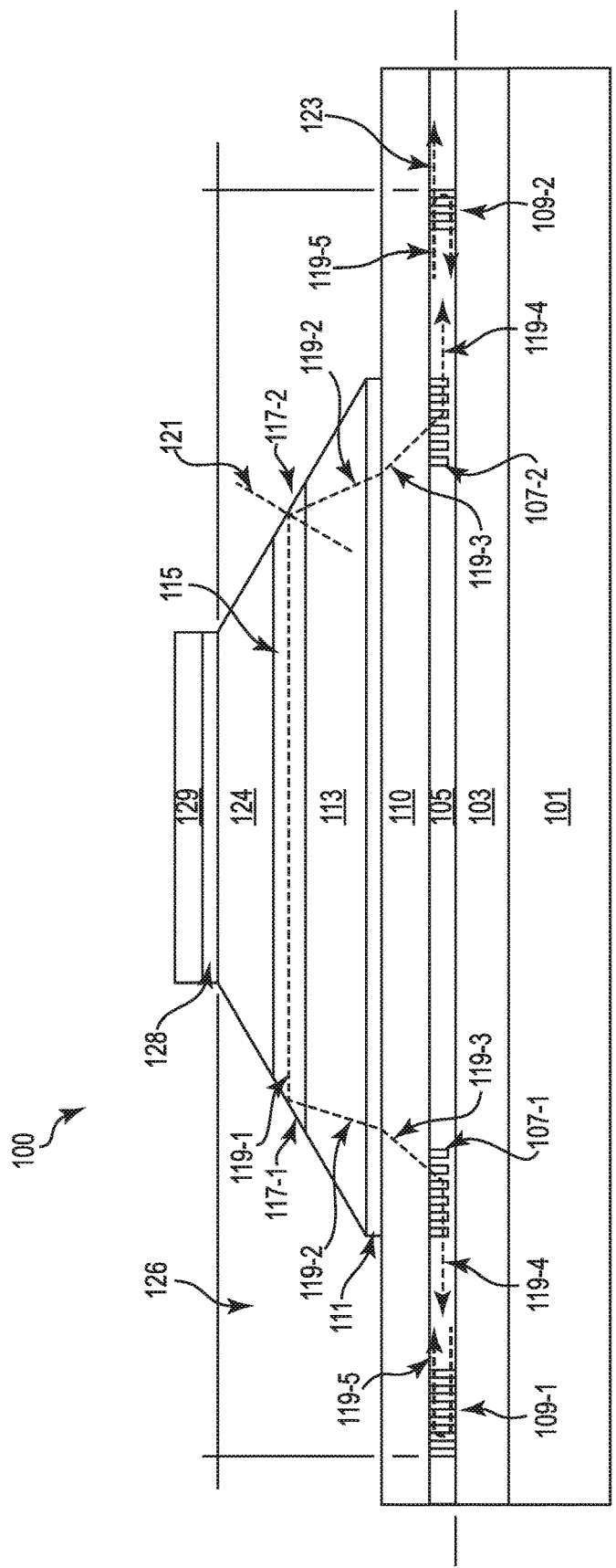
FIGS. 1A-1B illustrate examples of compact photonic platforms having a resonance cavity longer than an active region according to the present disclosure.
Figure 1B:
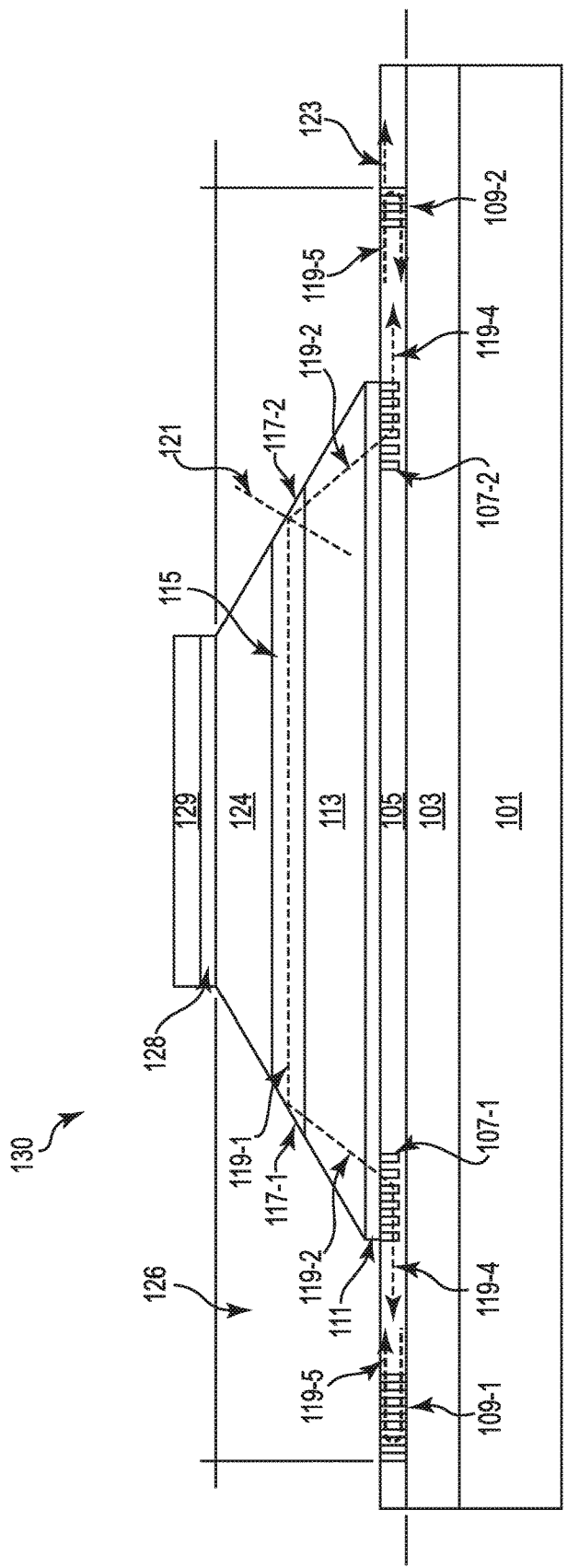

FIGS. 1A-1B illustrate examples of compact photonic platforms having a resonance cavity longer than an active region according to the present disclosure. Compact photonic platforms can be formed in various configurations that may include various constituents such as, for example, p-contacts and p-contact layers, n-contacts and n-contact layers, cladding layers, oxide layers, and substrate layers, among others. For purposes of the present disclosure, constituents directly relating to emission, modulation, and/or detection of photons and/or electrons are discussed in detail.

In the detailed description of the present disclosure, reference is made to the accompanying drawings that form a part hereof and in which is shown by way of illustration how examples of the disclosure may be practiced. These examples are described in sufficient detail to enable those of ordinary skill in the art to practice the examples of this disclosure and it is to be understood that other examples may be utilized and that process, electrical, and/or structural changes may be made without departing from the scope of the present disclosure. Further, where appropriate, as used herein, "for example' and "by way of example" should be understood as abbreviations for "by way of example and not by way of limitation". In addition, as used herein, "a number of" an element and/or feature can refer to one or more of such elements and/or features.

The figures herein follow a numbering convention in which the first digit or digits correspond to the drawing figure number and the remaining digits identify an element or component in the drawing. Similar elements or components between different figures may be identified by the use of similar digits. For example, 116 may reference element "16" in FIG. 1, and a similar element may be referenced as 216 in FIG. 2. Elements shown in the various figures herein may be added, exchanged, and/or eliminated so as to provide a number of additional examples of the present disclosure. In addition, the proportion and the relative scale of the elements provided in the figures are intended to illustrate the examples of the present disclosure and should not be taken in a limiting sense.

As illustrated in FIG. 1A, the example of the compact photonic platform 100 can include a substrate 101, an oxide 103, and a waveguide 105. The waveguide 105 can, in various examples, be supported by the substrate 101. In various examples, the substrate 101 can include a number of layers (e.g., silica on silicon, among others) formed from materials having refractive indices that differ from the waveguide 105 (e.g., formed from silicon, among other suitable materials). As such, for example, the substrate 101 may have a layer of oxide 103 (e.g., $SiO_2$) formed thereon and adjacent the waveguide 105.

In the example shown in FIG. 1A, a low refractive index layer 110 (e.g., a low-index dielectric, such as $SiO_2$ or a polymer, among others) can be formed and/or positioned on the waveguide 105 opposite from the substrate 101 and/or the oxide 103 formed thereon. The low-index layer 110 can reduce a potential for optical coupling of light propagating in active region 115 and adjacent layers (e.g., 113 and 124) into the waveguide 105, as described herein, if an effective waveguide index is higher than or similar to an effective index in the active region 115.

The compact photonic platform 100 can, in some examples, include an n-contact layer 111 formed and/or positioned on the low-index layer 110. The n-contact layer 111 and layers described herein that are formed and/or positioned thereon can be utilized to enable electrically-pumped light (e.g., photon) emission (e.g., via contribution to laser and/or amplifier functionality) and/or photodetection (e.g., via contribution to photons to electrical carriers conversion functionality). In various examples, a first cladding layer 113 can be formed and/or positioned on the n-contact layer 111.

As described herein, an active region 115 can be formed and/or positioned on the first cladding layer 113. The active region 115 can be formed from a gain medium material, or a number of layers thereof, that upon electrical stimulation can contribute to amplified production of photons of a particular number or a range of wavelengths. Being configured to produce the particular number or range of wavelengths can result from a cavity (e.g., a gain medium and/or a resonance cavity) having, for instance, different materials and/or configurations of active regions, different sizes and/or shapes of optical cavities, and/or different types of mirrors (e.g., reflectors, gratings, among other materials and/or configurations serving as mirrors), among other considerations, having components positioned in various configurations. For example, photons can be reflected from a junction between two materials such that the photons are confined to the gain medium where the amplification takes place. In some examples of the present disclosure, the active region can be a gain medium of a laser.

The gain medium material or materials, used to form active regions for generation of light (e.g., photon) wavelengths as described herein, can be formed from a variety of chemical materials including, for example, GaAs, InGaAs, AlGaAs, InAlGaAs, InGaAsP, InGaAlP, InGaAlN, among others, and/or combinations thereof. Just the abbreviations for the elements are used because different ratios of each element (e.g., stoichiometries) can be used in various examples of the present disclosure to, for example, affect the wavelengths achieved. Such gain medium materials can, in various examples, be utilized to form an active region of a particular length along a longitudinal axis of the compact photonic platform 100 that contributes to producing resonant wavelengths of light from electrical stimulation and/or contributes to producing electrons with energies corresponding to the electron-voltages of photons input to the active region and/or the gain medium, for example, via a waveguide.

In various examples, a second cladding layer 124 can be formed and/or positioned on the active region 115. The compact photonic platform 100 can, in some examples, include a p-contact layer 128 formed and/or positioned on the second cladding layer 124. In some examples, the p-contact layer 128 can have a p-contact 129 formed and/or positioned thereon.

Considering the example of the compact photonic platform 100 illustrated in FIG. 1A as being operated as a light (e.g., photon) emission device, electrical stimulation of the active region 115 (e.g., via electrons input through the p-contact 129, the p-contact layer 128, and/or the second cladding layer 124 and/or holes input from an n-contact, the n-contact layer 111 and/or the first cladding layer 113) can produce light 119-1 (e.g., photons) in the active region 115. At least some of the light 119-1 can travel substantially along a longitudinal axis of the active region 115 (e.g., toward both longitudinal ends of the active region 115).

A facet 117-1, 117-2 can be formed (e.g., cut, etched, among other techniques) at at least one longitudinal end of the active region 115 (e.g., in some examples, at each longitudinal end) to have an angle 121 no less than (e.g., equal to or greater than) a critical angle in order to provide internal reflection of the light 119-1 at the boundary of the facet (e.g., rather than allowing the light 119-1 be refracted externally through the facet). The angle 121 no less than the critical angle can, in various examples, depend on a ratio of an index of refraction of a refractive medium (e.g., air, among other refractive media) to an index of refraction of an incident medium (e.g., the gain medium material or materials used to form the active region 115).

Each facet 117-1, 117-2 can reflect the light 119-1 such that the direction of travel of the light 119-2 is internally reflected (e.g., toward and/or through the first cladding layer 113, the n-contact layer 111, and/or the low-index layer 110 (e.g., $SiO_2$)). In some examples, the first cladding layer 113, the n-contact layer 111, and/or the low-index layer 110 may have an index of refraction differing from that of the active region 115 such that a direction of travel of incident light 119-2 is changed to light 119-3 having a different direction of travel as the light 119-3 approaches grating couplers 107 on the waveguide 105.

The waveguide 105 can, in various examples, be integrated with (e.g., formed to include via etching, among other suitable techniques) at least one grating coupler 107-1, 107-2 positioned in alignment with incident light 119-3 in order to distally direct the light 119-4 within the waveguide 105. The grating couplers 107-1, 107-2 integrated with the waveguide 105 can have a predetermined pitch for refraction of incident light 119-3, for example, of a particular wavelength and/or at a particular incident angle from normal (e.g., perpendicular to the grating).

As used in the present disclosure, a grating's pitch means a regularly repeated distance between a beginning of one solid bar of the grating and a beginning of an adjacent solid bar of the grating. As such, the pitch traverses a width of one solid bar (e.g., tooth) and an adjacent empty space (e.g., groove) between the adjacent solid bars.

The pitch (in addition to the duty cycle) of each of the grating couplers 107-1, 107-2 can refract such that the incident light 119-3 travels in an intended direction 119-4 (e.g., distally) within the waveguide 105. The pitch ($\Lambda$) of the grating coupler for refracting light along the waveguide can be predetermined for a particular wavelength of incident light ($\lambda$) at a particular incident angle ($\Phi$) to normal (e.g., $\Phi$ can have a value of 0.0 when the incident light is provided normal to the grating) using the effective refractive index of the corrugated waveguide $n_{aveeff}$ (e.g., a propagation vector normalized versus air) averaged from effective refractive indices of grating teeth and groove regions, and incident light modal index $n_{in}$, by, for example, the following formula:

$$\Lambda = m\lambda / n_{aveeff} - n_{in} \sin \Phi)$$

where m is the grating order. Efficiency of the grating coupler may be improved, in various examples, by forming the grating coupler from high-index silicon, forming the grating coupler with a blazed grating, and/or placing a reflective material (e.g., a mirror) under the grating.

Each of the grating couplers 107-1, 107-2 can be formed to include a grating having a particular pitch and a particular duty cycle (e.g., via electron beam lithography, among other suitable etching techniques). As used in the present disclosure, a grating's duty cycle means a ratio of the width of the solid bar to the pitch. In some examples, the pitch can be constant (e.g., regularly repeated) across a span of a grating coupler because the width of the solid bars and empty spaces can be constant, which can also make the duty cycle constant. In some examples, a front end of a grating coupler (e.g., a portion where incident light first impacts the grating coupler) can be "chirped" such that the pitch and/or duty cycle of the front end are decreased relative to a back end (e.g., a portion adjacent to where light exits the grating coupler) such that, for example, back-reflection of the incident light into the waveguide is reduced.

Reflectors 109-1, 109-2 (e.g., serving as mirrors) can, in various examples, be integrated with the waveguide 105 and distally positioned relative to the grating couplers 107-1, 107-2. The reflectors 109-1, 109-2 can at least partially reflect light 119-5 in an opposite direction within the waveguide 105 from the light 119-4 distally directed by the grating couplers 107-1, 107-2. In various examples, a less-reflective reflector (e.g., reflector 109-2 in FIG. 1A) can be integrated distal from one of the grating couplers (e.g., grating coupler 107-2 in FIG. 1A) to enable (e.g., direct) output (e.g., emission) of light 123 in a predetermined direction.

Some properties affecting emitted light (e.g., photon wavelengths) can be determined by geometry of the optical cavity (e.g., a gain medium and/or a resonance cavity). Resonance can be a tendency of a system (e.g., a compact photonic platform) to oscillate at a greater amplitude at some frequencies than at other frequencies. A resonance cavity of a laser includes an arrangement of reflectors (e.g., mirrors) that form a standing wave resonator for light. A resonance cavity of a laser is associated with an active region 115 and provides reflective feedback of light produced by the active region. Light confined in the resonance cavity can reflect multiple times and produces standing waves for certain resonance frequencies.

Different resonance frequencies can be produced by differences in the configuration of and/or distance between the active region 115, reflectors 109-1, 109-2 (e.g., mirrors), and components between and/or associated with the active region and the reflectors to form the resonance cavity (e.g., the waveguide 105, the low-index layer 110, the n-contact layer 111, and/or the first and second cladding layers 113, 124, among others, shown in FIG. 1A). As such, the resonance cavity 126 illustrated in FIG. 1A can, for example, include components extending longitudinally between distal ends of the reflectors 109-1, 109-2 and vertically from a bottom edge of the waveguide 105 to the top edge of the second cladding layer 124. Hence, FIG. 1A illustrates an example of the compact photonic platform 100 having the resonance cavity 126 longer than (e.g., longitudinally) the active region 115.

A mode in a laser can be a standing lightwave. Particular modes and/or numbers of modes may result from various factors such as, for instance, a size and shape and/or particular materials of the active region, and the type of reflectors, among other considerations, affecting the resonance cavity 126. Photons can be reflected several times longitudinally between distal ends of the reflectors 109-1, 109-2 before they are emitted. As a light wave is reflected, it can be amplified by stimulated emission. If there is more amplification than loss (e.g., due to absorption and/or by incomplete reflection), the compact photonic platform 100 including the resonance cavity 126 begins to "lase".

The reflectors 109-1, 109-2 can, in various examples, be dielectric mirrors formed from a predetermined structure of a plurality of alternating layers of high and low refractive index materials that are a quarter-wavelength thick, which may be integrated in the waveguide 105 as distributed Bragg reflectors (DBRs). Such DBRs may provide a high degree of wavelength-selective reflectance at a desired free surface wavelength if the thicknesses of the alternating layers and the refractive indices are such that they lead to constructive interference of partially reflected waves at the interfaces. Alternatively or addition, the reflectors 109-1, 109-2 can, in various examples, be distributed feedback (DFB) gratings, which can be integrated in the waveguide 105 to, for example, reflect a particular band of wavelengths to contribute to a particular lasing mode.

In various examples, reflectivity of the reflectors 109-1, 109-2 (e.g., the DBRs and/or the DFB gratings) can be changed (e.g., thermally, electrically, among other suitable input modalities). Accordingly, the output wavelengths (e.g., emission) of the light 123 is tunable (e.g., by a user) and/or output intensity of the light 123 can be modulated by changing the reflectivity of the reflectors 109-1, 109-2 (e.g., separately from changing parameters of other components, such as the active region 115, by a manufacturer).

FIG. 1B illustrates another example of a compact photonic platform having a resonance cavity longer than an active region according to the present disclosure. As illustrated in FIG. 1B, the example of the compact photonic platform 130 can include a substrate 101, an oxide 103, and a waveguide 105, for example, as described with regard to FIG. 1A.

In contrast to the example shown in FIG. 1A, the example shown in FIG. 1B does not include a low refractive index layer (e.g., as shown at 110 in FIG. 1A) formed and/or positioned on the waveguide 105 opposite from the substrate 101 and/or the oxide 103 formed thereon. The low-index layer can be omitted if a potential for coupling of the waveguide 105 with an adjacent active region 115, as described herein, is low due to an effective waveguide index being markedly lower than an effective index of the active layer 115. As such, the compact photonic platform 130 can, in some examples, include an n-contact layer 111 formed and/or positioned directly on the waveguide 105.

Other components of the example of the compact photonic platform 130 shown in FIG. 1B can, in various examples, be formed as and/or include the components and/or functionalities as described with regard to FIG. 1A. For example, FIG. 1B also illustrates an example of the compact photonic platform 130 having the resonance cavity 126 longer than (e.g., longitudinally) the active region 115.

Figure 2:
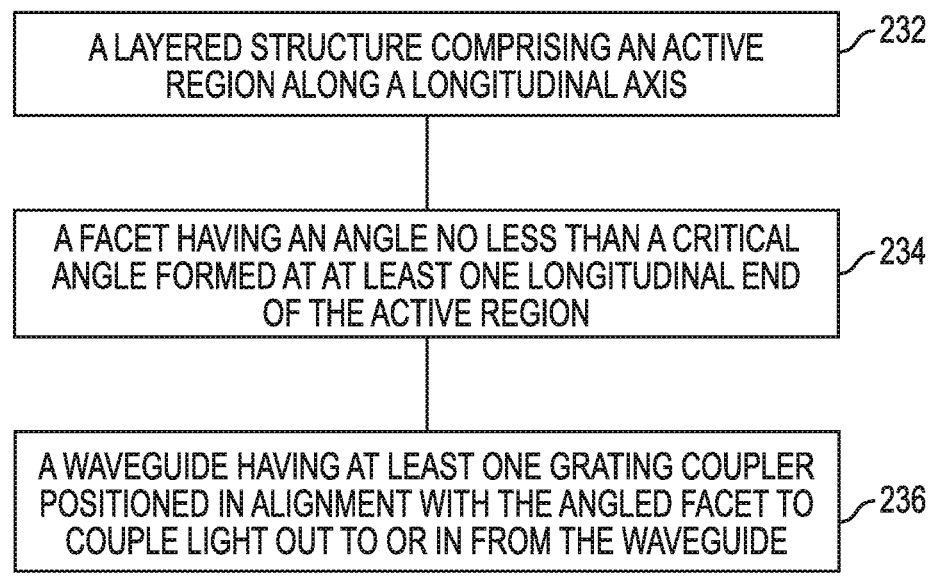
FIG. 2 illustrates a block diagram of an example of a compact photonic platform formed according to the present disclosure.

FIG. 2 illustrates a block diagram of an example of a compact photonic platform formed according to the present disclosure. As shown in block 232 and consistent with the examples illustrated in FIGS. 1A-1B, a compact photonic platform (e.g., 100, 130) can include a layered structure having an active region (e.g., 115) along a longitudinal axis. As shown in block 234, a facet (e.g., 117-1, 117-2) having an angle (e.g., 121) no less than a critical angle can be formed at at least one longitudinal end of the active region (e.g., 115). As shown in block 236, a waveguide (e.g., 105) having at least one grating coupler (e.g., 107-1, 107-2) can be positioned in alignment with the angled facet (e.g., 117-1, 117-2) to couple light out to or in from the waveguide (e.g., 105). In various examples, a resonance cavity (e.g., 126) can be effectuated by forming reflectors, as described herein, on and/or in a waveguide and/or an active region, among other components.

In various examples the compact photonic platforms disclosed herein can, for example, be utilized as a laser, a modulator, and/or a photodetector, among other implementations. For example, a waveguide (e.g., 105) having at least one grating coupler (e.g., 107-1, 107-2) can be positioned in alignment with light (e.g., 119-2, 119-3) to be internally reflected (e.g., 119-2) by the facets (e.g., 117-1, 117-2) to distally direct the light (e.g., 119-4) within the waveguide (e.g., 105) (e.g., as a laser).

In some examples, as illustrated in FIGS. 1A-1B (along with FIGS. 3A-3B and 4), the waveguide can have a longitudinal axis that is substantially in-plane with the longitudinal axis of the active region at least between the facets at each longitudinal end of the active region. That is, the waveguide can be substantially parallel to the active region at least between the facets at each longitudinal end of the active region and/or between the front and/or back ends of the grating couplers in order to facilitate the alignment with the light to be internally reflected by the facets.

As described herein, a reflector (e.g., 109-1, 109-2) (e.g., a DBR and/or a DFB grating) can be positioned in the waveguide (e.g., 105) distally from each of two grating couplers (e.g., 107-1, 107-2), where the reflectors are separately tunable from the active region. In various examples, the reflectors (e.g., 109-1, 109-2) can contribute to forming a resonance cavity (e.g., 126). In some examples, a less-reflective reflector (e.g., 119-5) (e.g., a DBR and/or a DFB grating that is more partially reflective than the other DBR and/or a DFB grating) can be positioned distally from one grating coupler (e.g., 107-2) to direct output (e.g., emission) of the light 123 in a predetermined direction.

As described herein, a compact photonic platform (e.g., 100, 130) can have a resonance cavity (e.g., 126) that includes the active region (e.g., 115) and the waveguide (e.g., 105), where the resonance cavity (e.g., 126) extends between distal ends of the reflectors (e.g., 109-1, 109-2) (e.g., a DBR and/or a DFB grating) positioned in the waveguide. In various examples, the resonance cavity (e.g., 126) can further include a number of layers of the layered structure (e.g., 110, 111, and/or 113) positioned between the active region (e.g., 115) and the waveguide (e.g., 105).

FIGS. 3A-3B illustrate examples of compact photonic platforms having a resonance cavity shorter than an active region according to the present disclosure. As illustrated in FIGS. 3A-3B, the examples of the compact photonic platform 340-1, 340-2 can include a substrate 301, an oxide 303, and a waveguide 305, for example, as described with regard to FIGS. 1A-1B. In contrast to the example shown in FIG. 1A, the examples shown in FIGS. 3A-3B do not include a low refractive and/or reflective index layer (e.g., as shown at 110 in FIG. 1A) formed and/or positioned on the waveguide 305 opposite from the substrate 301 and/or the oxide 303 formed thereon. However, in some examples, such a low-index layer can be included if an effective waveguide index is higher than or similar to an effective gain index. As such, the compact photonic platforms 340-1, 340-2 can, in some examples, include an n-contact layer 311 formed and/or positioned directly on the waveguide 305.

Other components of the example of the compact photonic platforms 340-1, 340-2 shown in FIGS. 3A-3B can, in various examples, be formed as and/or include the components and/or functionalities as described with regard to FIGS. 1A-1B. However, FIGS. 3A-3B illustrate examples of the compact photonic platforms 340-1, 340-2 having the resonance cavity 344 shorter than (e.g., longitudinally) the active region 315, in contrast to FIGS. 1A-1B illustrating examples of the compact photonic platforms 100, 130 having the resonance cavity 126 longer than (e.g., longitudinally) the active region 115.

As such, as shown in FIG. 3A, the second cladding layer 324 (e.g., the cladding layer on an opposite side of the active region 315 from the waveguide 305) can have at least portions of two DBRs 341-1, 341-2, in various examples, formed and/or positioned therein. In some examples, another portion of each DBR 341-1, 341-2 can be formed and/or positioned in a p-contact layer 328. As described herein, two DBRs (e.g., 341-1, 341-2) can be utilized as reflectors that contribute to forming a resonance cavity (e.g., 344) (e.g., a resonance cavity of a laser). Accordingly, as shown in FIG. 3A, the two DBRs 341-1, 341-2 can be positioned to have distal ends thereof positioned to form a resonance cavity 344 that is shorter than a longitudinal axis of the active region 315.

As such, light 343-1 produced in the active region 315 can be reflected several times longitudinally between distal ends of the two DBRs 341-1, 341-2 before escaping (e.g., being emitted from) the resonance cavity 344. As the light 343-1 is reflected, it can be amplified by stimulated emission. If there is more amplification than loss (e.g., due to absorption and/or by incomplete reflection), the compact photonic platform 340-1 including the resonance cavity 344 functions as a laser.

The light 343-2 emitted from the active region 315 can be, as described herein, internally reflected by facets 317-1, 317-2 formed (e.g., cut, etched, among other techniques) at each longitudinal end of the active region 315 to have an angle 321 no less than (e.g., equal to or greater than) a critical angle in order to provide internal reflection of the light 343-3 at the boundary of the facet. Each facet 317-1, 317-2 can reflect the light 343-2 such that the direction of travel of the light 343-3 is internally reflected (e.g., toward and/or through the first cladding layer 313, the n-contact layer 311, and/or a possible low-index layer (not shown). Although not shown as such in FIGS. 3A-3B, in some examples, the first cladding layer 313, the n-contact layer 311, and/or the possible low-index layer may have an index of refraction differing from that of the active region 315 such that a direction of travel of incident light 343-3 is changed to light having a different direction of travel as the light approaches the waveguide 305.

The waveguide 305 can, in various examples, be integrated with (e.g., formed to include via etching, among other suitable techniques) at least one grating coupler 307-1, 307-2 positioned in alignment with incident light 343-3 in order to distally direct the light 343-4 within the waveguide 305. The grating couplers 307-1, 307-2 integrated with the waveguide 305 can have a predetermined pitch for refraction of incident light 343-3, for example, of a particular wavelength and/or at a particular incident angle from normal (e.g., perpendicular to the grating). In contrast to FIGS. 1A-1B, the distally directed light 343-4 has already been amplified (e.g., to lase) by the DBRs (e.g., 341-1, 341-2) in the resonance cavity 344 that is shorter than the active region 315. Hence, the reflectors (e.g., 109-1, 109-2) shown in FIGS. 1A-1B as being integrated in the waveguide (e.g., 105) can be omitted from the compact photonic platforms 340-1, 340-2 shown in FIGS. 3A-3B.

FIG. 3B illustrates another example of a compact photonic platform having a resonance cavity shorter than an active region according to the present disclosure. In contrast to the example shown in FIG. 3A having two DBRs 341-1, 341-2, the example shown in FIG. 3B includes a second cladding layer 324 that can have at least portions of two DFB gratings 342-1, 342-2, in various examples, formed and/or positioned therein. In some examples, another portion of each DFB grating 342-1, 342-2 can be formed and/or positioned in the p-contact layer 328. As described herein, two DFB gratings (e.g., 342-1, 342-2) can be utilized as reflectors that contribute to forming a resonance cavity (e.g., 344). Accordingly, as shown in FIG. 3B, the two DFB gratings 342-1, 342-2 can be positioned to have distal ends thereof positioned to form a resonance cavity 344 that is shorter than a longitudinal axis of the active region 315.

As such, light 343-1 produced in the active region 315 can be reflected several times longitudinally between distal ends of the two DFB gratings 342-1, 342-2 before escaping (e.g., being emitted from) the resonance cavity 344. As the light 343-1 is reflected, it can be amplified by stimulated emission (e.g., to function as a laser).

Other components of the example of the compact photonic platform 340-2 shown in FIG. 3B can, in various examples, be formed as and/or include the components and/or functionalities as described with regard to FIG. 3A. For example, FIG. 3B also illustrates an example of the compact photonic platform 340-2 having the resonance cavity 344 shorter than the active region 315.

Accordingly, consistent with the examples illustrated in FIGS. 3A-3B, a compact photonic platform (e.g., 340-1, 340-2) can have a layered structure including an active region (e.g., 315) along a longitudinal axis, a facet (e.g., 317-1, 317-2) having an angle (e.g., 321) no less than (e.g., equal to or greater than) a critical angle formed at at least one (e.g., each) longitudinal end of the active region (e.g., 315). The compact photonic platform can further include a waveguide (e.g., 305) having a grating coupler (e.g., 307-1, 307-2) positioned in alignment with light (e.g., 342-3) to be internally reflected by each of the facets (e.g., 317-1, 317-2) to distally direct the light (e.g., 343-4) within the waveguide (e.g., 305), and a cladding layer (e.g., 324) on an opposite side of the active region (e.g., 315) from the waveguide (e.g., 305).

The compact photonic platform (e.g., 340-1, 340-2, 130) can, in various examples, have a resonance cavity (e.g., 344) that includes portions of the active region (e.g., 315), cladding layers (e.g., 313, 324) on both sides of the active region (e.g., 315), and the waveguide (e.g., 305), where each of the portions is shorter than the longitudinal axis of the active region (e.g., 315), as shown in FIGS. 3A-3B. As described herein, the cladding layer (e.g., 324) on the opposite side of the active region 315) can, in various examples, include at least portions of two DBRs (e.g., 341-1, 341-2) having distal ends positioned to form a resonance cavity (e.g., 344) shorter than the longitudinal axis of the active region (e.g., 315). Alternatively or in addition, the cladding layer (e.g., 324) can, in various examples, include at least portions of two DFB gratings (e.g., 342-1, 342-2) having distal ends positioned to form a resonance cavity (e.g., 344) shorter than the longitudinal axis of the active region (e.g., 315).

Figure 4:
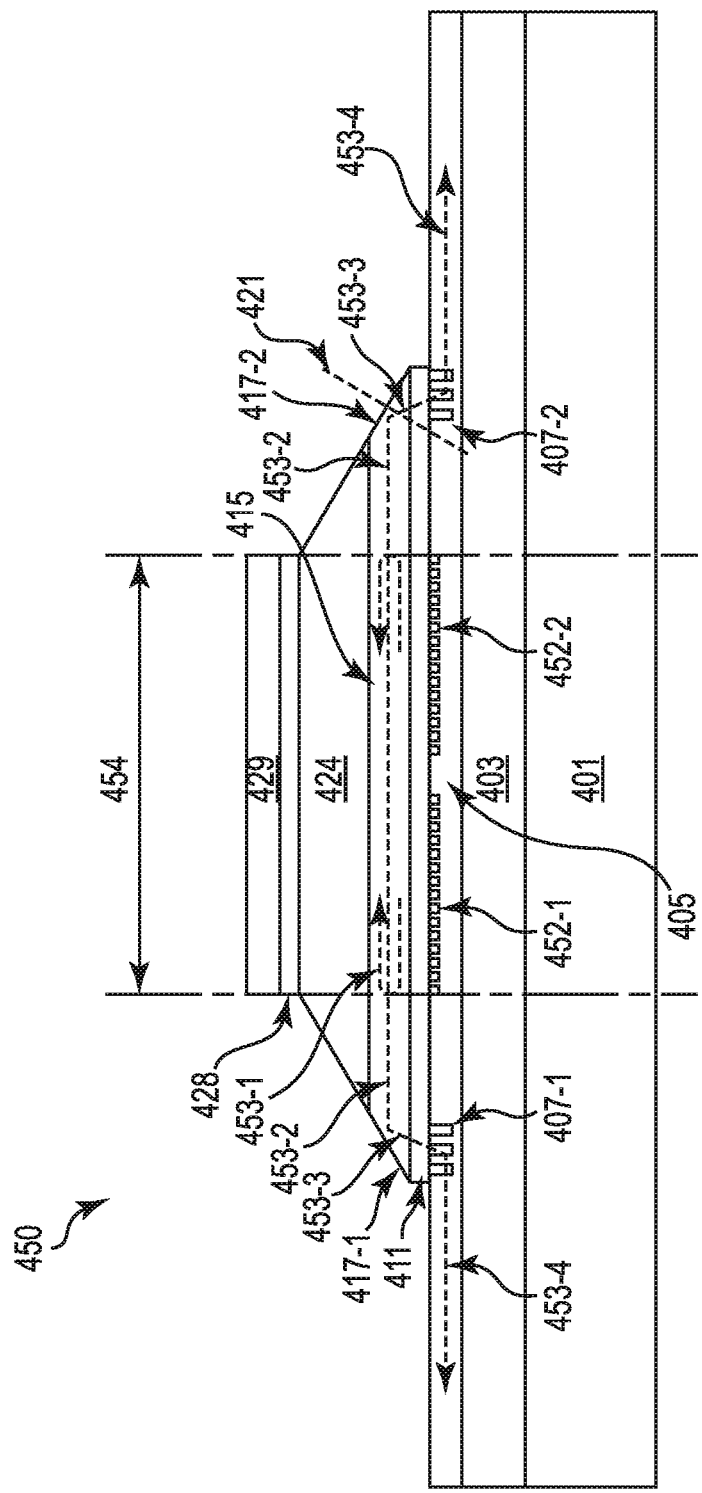
FIG. 4 illustrates another example of a compact photonic platform having a resonance cavity shorter than an active region according to the present disclosure.

FIG. 4 illustrates another example of a compact photonic platform having a resonance cavity shorter than an active region according to the present disclosure. As illustrated in FIG. 4, the example of the compact photonic platform 450 can include a substrate 401, an oxide 403, and a waveguide 405, for example, as described with regard to FIGS. 1A-1B and/or 3A-3B. Because the active region 415 is intended to directly interact with structures, as described herein, integrated in the waveguide 405 (e.g., when a mode of light produced in the active region 415 is strong enough in the waveguide 405), an n-contact layer 411 can be formed and/or positioned directly on the waveguide 405 (e.g., without a cladding layer and/or oxide layer between the n-contact layer 411 and the waveguide 405).

Other components of the example of the compact photonic platform 450 shown in FIG. 4 can, in various examples, be formed as and/or include the components and/or functionalities as described with regard to FIGS. 1A-1B and 3A-3B. However, FIG. 4 illustrates an example of the compact photonic platform 450 having the resonance cavity 454 shorter than the active region 415, in contrast to FIGS. 1A-1B illustrating examples of the compact photonic platforms 100, 130 having the resonance cavity 126 longer than (e.g., longitudinally) the active region 115.

As such, as shown in FIG. 4, the waveguide 405 can have two DFB gratings 452-1, 452-2, in various examples, integrated (e.g., formed and/or positioned) therein. As described herein, two DFB gratings (e.g., 452-1, 452-2) can be utilized as reflectors that contribute to forming a resonance cavity (e.g., 454) (e.g., a resonance cavity of a laser). Accordingly, as shown in FIG. 4, the two DFB gratings 452-1, 452-2 can be positioned to have distal ends thereof positioned to form a resonance cavity 454 that is shorter than a longitudinal axis of the active region 415.

As such, light 453-1 produced in the active region 415 can be reflected several times longitudinally between distal ends of the two DFB gratings 452-1, 452-2 in the waveguide 405 before escaping (e.g., being emitted from) the resonance cavity 454. As the light 453-1 is reflected, it can be amplified by stimulated emission. If there is more amplification than loss (e.g., due to absorption and/or by incomplete reflection), the compact photonic platform 450 including the resonance cavity 454 functions as a laser.

The light 453-2 emitted from the active region 415 can be, as described herein, internally reflected by facets 417-1, 417-2 formed (e.g., cut, etched, among other techniques) at each longitudinal end of the active region 415 to have an angle 421 greater than a critical angle in order to provide internal reflection of the light 453-3 at the boundary of the facet. Each facet 417-1, 417-2 can reflect the light 453-2 such that the direction of travel of the light 453-3 is internally reflected (e.g., toward and/or through the n-contact layer 411).

The waveguide 405 can, in various examples, be integrated with (e.g., formed to include via etching, among other suitable techniques) at least one grating coupler 407-1, 407-2 positioned in alignment with incident light 453-3 in order to distally direct the light 453-4 within the waveguide 405. The grating couplers 407-1, 407-2 integrated with the waveguide 405 can have a predetermined pitch for refraction of incident light 453-3, for example, of a particular wavelength and/or at a particular incident angle from normal (e.g., perpendicular to the grating). Similar to FIGS. 3A-3B, the distally directed light 453-4 has already been amplified (e.g., to lase) by the gain medium in the active region 415 in the resonance cavity 454 that is shorter than the active region 415. Hence, the reflectors (e.g., 109-1, 109-2) shown in FIGS. 1A-1B as being integrated in the waveguide (e.g., 105) can be omitted from the compact photonic platform 450 shown in FIG. 4.

Accordingly, a method of fabricating a compact photonic platform 450 shown in FIG. 4 can, in various examples, be performed. Unless explicitly stated, the method examples described herein are not constrained to a particular order or sequence. Additionally, some of the described method examples, or elements thereof, can occur or be performed at the same, or substantially the same, point in time.

As described in the present disclosure, fabricating a compact photonic platform can, in various examples, include processing a stack of semiconductor materials to form a first layered structure (e.g., 411, 415, 424, 428, and/or 429) that includes an active region (e.g., 415) along a longitudinal axis, where the active region (e.g., 415) is formed to include a facet (e.g., 417-1, 417-2) at each longitudinal end having an angle (e.g., 421) greater than a critical angle. In addition, fabricating the compact photonic platform can, in various examples, include processing a stack of materials to form a second layered structure (e.g., 401, 403, and/or 405) that includes a waveguide (e.g., 405). The waveguide (e.g., 405) can be formed to have two reflecting structures (e.g., 452-1, 452-2) having distal ends positioned to form a resonance cavity (e.g., 454) shorter than the longitudinal axis of the active region (e.g., 415) and a grating coupler (e.g., 407-1, 407-2) positioned in alignment with light (e.g., 453-3) to be internally reflected by at least one of the facets (e.g., 417-1, 417-2) and formed to distally direct the light (e.g., 453-4) within the waveguide (e.g., 405).

Processing as described herein can, for example, be performed by applying appropriate deposition and/or etching techniques to a stack of materials (e.g., semiconductor materials), although the present disclosure is not limited to these types of implementation. For example, processing can, in various examples, include epitaxially growing a stack of materials (e.g., semiconductor materials). Epitaxial growth is a technique that can be used to fabricate various electronic and optical devices. Such devices can have a complicated structure, which may be formed from a number of thin layers with various compositions. Processing can, for example, include utilizing electron-beam lithography to etch predetermined variations in pitch, duty cycle, etc., of each grating coupler, DBR, and/or DFB grating such that the predetermined variations contribute to directing (e.g., emitting) predetermined wavelengths (e.g., lasing wavelengths) from at least one end of the waveguide.

Fabricating the compact photonic platform can, in various examples, include the stack of materials being processed to form two DBRs as the reflecting structures. Alternatively or in addition, fabricating the compact photonic platform can, in various examples, include the stack of materials being processed to form two DFB gratings as the reflecting structures.

Fabricating the compact photonic platform can, in various examples, include the stack of materials being processed to form a compact hybrid photonics platform by attaching (e.g., via a flip-chip process and bonding thereto, among other appropriate bonding techniques) the first layered structure substantially in-plane to the second layered structure. Alternatively, fabricating the compact photonic platform can, in various examples, include the stack of materials being processed to form a compact monolithic photonics platform by forming the first layered structure on the second layered structure (e.g., via epitaxial growth, among other appropriate techniques for forming a monolithic structure), where layers of the first and second layered structures are formed substantially in-plane.

Consistent with the present disclosure, when the active region is reversely biased from a bias utilized to emit light, the compact photonic platform can become suitable for implementation as a photodetector or electroabsorption modulator. The reflectors (e.g., DBRs and/or DFB gratings) also can be tuned, as described herein, to modulate a quality factor (Q) of the resonance cavity to result in laser or light emitting diode (LED) output, among other types of amplification. If light propagates into a resonance cavity from one reflector, progresses through the resonance cavity, and exits from the resonance cavity through another reflector, a bias on the reflectors can be modulated to result in the compact photonic platform becoming suitable for implementation as a hybrid phase modulator.

Examples of the present disclosure may include compact photonics platforms and methods of forming the same, including executable instructions and/or logic to facilitate fabricating and/or operating the compact photonics platforms. Processing resources can include one or more processors able to access data stored in memory to execute the formations, actions, functions, etc., as described herein. As used herein, "logic" is an alternative or additional processing resource to execute the formations, actions, functions, etc., described herein, which includes hardware (e.g., various forms of transistor logic, application specific integrated circuits (ASICs), etc.), as opposed to computer executable instructions (e.g., software, firmware, etc.) stored in memory and executable by a processor.

It is to be understood that the descriptions presented herein have been made in an illustrative manner and not a restrictive manner. Although specific examples for apparatuses, systems, methods, computing devices, and instructions have been illustrated and described herein, other equivalent component arrangements, instructions, and/or device logic can be substituted for the specific examples presented herein without departing from the spirit and scope of the present disclosure.

What is claimed:

1. A method of fabricating a compact photonics platform, comprising:
    processing a stack of semiconductor materials to form a first layered structure comprising an active region along a longitudinal axis, wherein the active region is formed to comprise a facet at each longitudinal end having an angle no less than a critical angle; and
    processing a stack of materials to form a second layered structure comprising a waveguide, wherein the waveguide is formed to comprise:
        two reflecting structures having distal ends positioned to form a resonance cavity shorter than the longitudinal axis of the active region; and
        a grating coupler positioned in alignment with light to be internally reflected by at least one of the facets and formed to distally direct the light within the waveguide.

2. The method of claim 1, wherein processing the stack of materials to form the second layered structure comprises forming two distributed Bragg reflectors as the reflecting structures.

3. The method of claim 1, wherein processing the stack of materials to form the second layered structure comprises forming two distributed feedback gratings as the reflecting structures.

4. The method of claim 1, comprising fabricating a compact hybrid photonics platform by attaching the first layered structure substantially in-plane to the second layered structure.

5. The method of claim 1, comprising fabricating a compact monolithic photonics platform by forming the first layered structure on the second layered structure, wherein layers of the first and second layered structures are formed substantially in-plane.

\* \* \* \* \*